May 18, 1965 F. T. SPERA 3,184,699

MOUNTING MEANS FOR ELECTRICAL COMPONENTS

Filed April 2, 1963

INVENTOR
FRANK T. SPERA
BY
Harry W. Hargis III
AGENT

United States Patent Office 3,184,699

Patented May 18, 1965

3,184,699
MOUNTING MEANS FOR ELECTRICAL COMPONENTS

Frank T. Spera, Philadelphia, Pa., assignor to Philco Corporation, Philadelphia, Pa., a corporation of Delaware Filed Apr. 2, 1963, Ser. No. 270,104
6 Claims. (Cl. 339—17)

This invention relates to electrical apparatus, and more particularly to means for mounting electrical components upon wiring panels.

In wiring panels of the so-called "printed" type it is generally the practice to affix components thereto by solder attachment of the component lead wires to terminal portions of the wiring carried by the panel. In the attachment of micro-modulator components of known type a relatively large number of leads or wires extend from a relatively small casing, and care must be taken that the leads are maintained in spaced alignment to prevent electrical shorting of one lead to another and to ensure proper electrical connection with the terminal means of associated panel wiring.

It is therefore an objective of the invention to provide improved means for mounting relatively small electrical components upon a panel, through the agency of relatively thin leads extending from the components.

It is still another object of the invention to provide novel means facilitating rigid attachment of small electrical components upon wiring panels.

It is still a further objective of the invention to provide novel means for maintaining alignment of relatively thin and flexible lead wires of a component, while providing for mounting of said component upon a wiring panel by means of its lead wires.

In achievement of the foregoing and other objectives, the invention contemplates, in electrical apparatus, the combination of wiring panel means having apertures extending therethrough, electrical component means including lead wires extending therefrom and having loop portions disposed within said apertures, said loop portions being disposed for engagement with side walls of said apertures, spacer means extending into said apertures and forcibly urging said loop portions against the mentioned side walls of said apertures, and electrical circuit means carried by said panel means electrically connected with said loop portions of the lead wires.

It is a feature of the invention that the spacer means maintains spaced relationship between the lead wires while retaining the component means upon the wiring panel.

For a more complete understanding of the invention, reference may be had to the following description taken in light of the accompanying drawing, in which.

Figure 1:
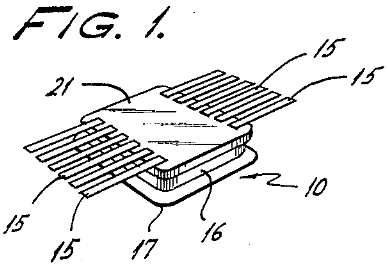
FIGURE 1 is a perspective showing of component means as to which the invention has particular utility.
Figure 2:
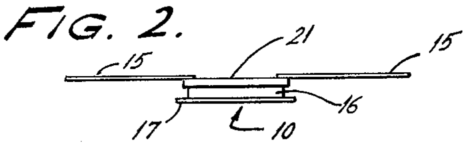
FIGURE 2 is an elevational showing of the component means seen in FIGURE 1.

With more detailed reference to the drawing, and first to FIGURES 1 and 2, there is illustrated an electrical component means which, by way of example, is a micromodule device 10 of known type adapted for attachment to a wiring panel by novel mounting means hereinafter to be more fully described.

Figure 4:
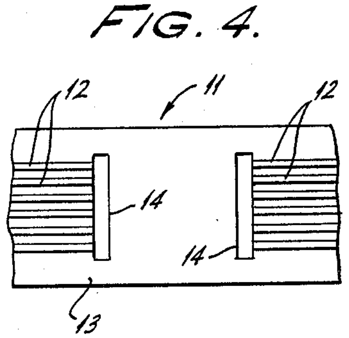
FIGURE 4 is a plan view, with parts broken away, showing a wiring panel upon which the component means of FIGURE 3 is to be mounted.

One example of a wiring panel is illustrated in fragmentary form in FIGURE 4, and is designated by the numeral 11. The panel 11 includes printed wiring elements 12 adherent to and extending over surface regions of an insulative board 13. Wiring elements 12 include end portions (not identified) that serve as terminal means and are disposed along the one side of each of a pair of generally rectangular apertures 14 extending through insulative panel board 13. The terminal portions of the wiring circuit elements are adapted for engagement by individual lead wires 15 of device 10, as hereinafter will be more fully described.

The device 10 comprises a generally box-shaped housing 16 including a base portion 17 and an insulative portion 21 through which a pair of rows of spaced lead wires 15 extend. Lead wires 15, preferably but not necessarily, are generally ribbon shaped, and desirably prior to attachment to the panel are bent either simultaneously or individually to the shape illustrated in FIGURE 3, so that they comprise rows of generally U-shaped loop portions 22 that are insertable into rectangular apertures 14( FIGURE 5). Following insertion of the loop portions 22 into the apertures spacer means 23 as shown in FIGURE 6 is forced into the opening (FIGURE 5) whereby to urge the wires toward the walls of the aperture as well as toward the adjacent terminal portions of the wiring circuit, as illustrated in FIGURE 7.

Figure 6:
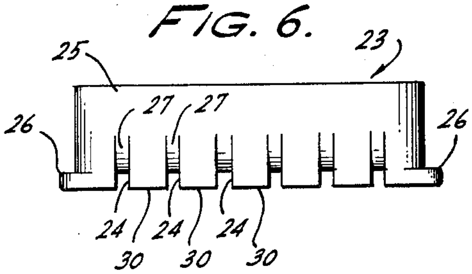
FIGURE 6 is an elevational showing, on a somewhat enlarged scale, of spacer means used in the inventive combination.
Figure 8:
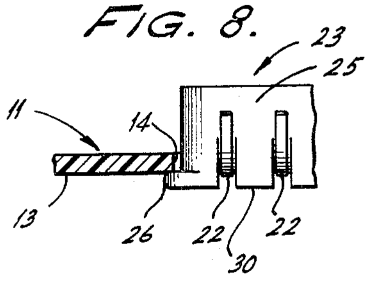
FIGURE 8 is a fragmentary sectional view illustrating additional details of the inventive combination.

With more particular reference to FIGURE 6, the spacer means 23 comprises a generally comb-shaped, elongated element having notched portions 24, each corresponding to the position of a lead wire loop portion 22 (see also FIGURE 8). The notched portions 24 are rounded, as seen at 27, substantially to conform to loop portions 22 of lead wires 15. The side wall portions 25 of the spacer means are substantially vertical.

Flanges or tabs 26 project from ends of the comb-shaped element and are so positioned that upon insertion of the spacer means into an opening 14 the tabs may be first flexed then released to extend under the panel beyond the aperture. Overlapping of tabs 26 onto surfaces of board 13, in combination with frictional forces between loop portions 22 and notches 24, securely locks the spacer means and component assembly in place, as shown in FIGURE 8. Preferably, but not necessarily, spacer means 23 is made of a flexible and resilient insulative material, such for example as nylon, and may be of such size relative to an aperture 14 as resiliently to urge loop portions 22 of the lead wires into engagement with the walls of the aperture and with terminal portions of the circuit elements.

Figures 3, 5, 7:
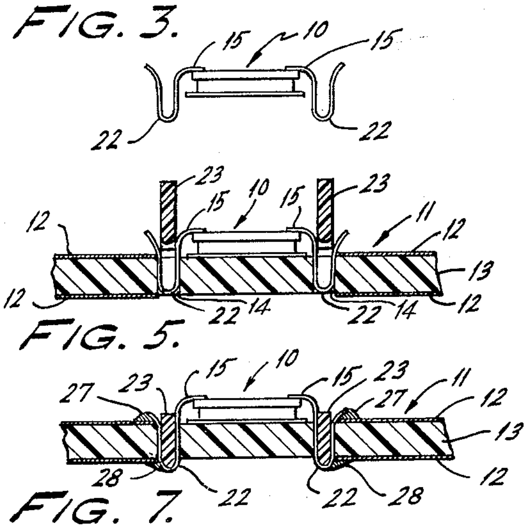
FIGURE 3 is a view similar to FIGURE 2, but with the lead wire elements of the component means performed for insertion into apertures of a wiring panel.
FIGURE 5 is an elevational showing, partly in section, illustrating generally the positional relationship between the mounted component means and the wiring panel.
FIGURE 7 is a showing similar to FIGURE 5, and illustrating the component means and spacer means assembled with the wiring panel.
Figure 9:
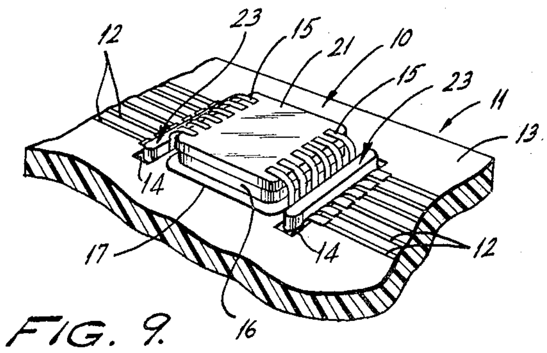
FIGURE 9 is a top perspective showing of the combination of elements illustrated in FIGURES 7 and 8.

Following asssembly of the elements as described, and with particular reference to FIGURE 7, the lead wires are soldered to the terminal portions of the printed wiring circuits. Solder shown at 27 and 28 may be applied by known means such as, for example, by wave soldering (solder 28) or by top soldering (solder 27) techniques. However, it will be understood that fewer solder connections may be made than are illustrated, inasmuch as wiring 12 may extend over but one surface region of board 13 to the exclusion of another surface region.

Further, it will be appreciated that the "tooth" portions 30 of the comb-shaped spacer means advantageously separate the lead wire loop portions 22 for the soldering operation, whereby bridging of solder from one lead wire to the other is prevented.

While a single, preferred embodiment of the invention has been described, it will be understood that modifications thereof may be made without departing from the scope of the appended claims.

I claim:

1. In electrical apparatus, the combination comprising: a wiring panel having apertures extending therethrough; electrical component means having generally U-shaped lead wires extending therefrom and into said apertures, each leg portion of each said lead wire being disposed adjacent a corresponding side wall of the one of said apertures into which it extends; electrically insulative spacer means extending into said apertures and forcibly urging said leg portions apart and toward the mentioned side walls of said apertures; and wiring circuit terminal means electrically connected with said leg portions of the lead wires.

2. Apparatus according to claim 1, and further characterized in that said lead wires are disposed in side-by-side spaced relationship, each said aperture is generally elongate in shape, and each said wedge means comprises an elongated, generally comb-shaped insulative body having tab portions that extend beyond the edges of said aperture, said U-shaped lead wires extending through notched portions of said comb-shaped wedge means, lateral portions of each said wedge means urging leg portions of said lead wires into engagement with said walls of each said aperture, and said tab portions locking each said wedge means within its associated aperture.

3. In electrical apparatus, the combination comprising: wiring panel means having apertures extending therethrough; electrical circuit means carried by said panel means and including terminal portions disposed adjacent said apertures; electrical component means disposed upon said panel means and including generally ribbon-shaped lead wires extending therefrom, said wires having reversely bent loop portions extending into said apertures; each said loop portion including a pair of leg portions and a connecting portion, the leg portions being disposed for frictional engagement with side walls of the associated aperture; and electrically insulative spacer means extending into said apertures and forcibly urging said leg portions against the mentioned side walls of said apertures.

4. Apparatus according to claim 3, and further characterized in that said lead wires are disposed in side-by-side spaced relationship, and said spacer means comprises a generally comb-shaped insulative body, said lead wires extending through notched portions of said spacer means and spaced apart by tooth portions of said body, and lateral portions of said insulative body urging each leg portion of said lead wires into engagement with side walls of said apertures.

5. In electrical apparatus, the combination comprising: insulative panel means having an aperture extending therethrough; wiring circuits extending across said panel means and including terminal portions disposed adjacent said aperture; electrical component means including lead wires extending therefrom, said lead wires extending into said aperture and further being reversely bent to extend outwardly from said aperture in a region adjacent said terminal portions; insulative spacer means disposed within said aperture and urging said bent lead wires into frictional engagement with side walls of said aperture; and means for electrically connecting said lead wires with said terminal portions.

6. For use with a wiring panel having an aperture extending therethrough in the region of wiring circuit terminal means, spacer means insertible into said aperture for providing forcible engagement of generally U-shaped loop portions of component leads with side wall portions of said aperture whereby to provide for connection of said leads to said terminal means, said spacer means comprising: a generally comb-shaped main body of electrically insulative material provided with slotted portions through which said U-shaped leads normally extend, lateral portions of said body portion being shaped and dimensioned to urge leg portions of said leads into the mentioned engagement with said aperture; and tab portions on said spacer means disposed to extend beyond said aperture and across surfaces of such panel to lock the spacer means within the asosciated aperture and against said leads.

References Cited by the Examiner

UNITED STATES PATENTS

| | | | |
|---|---|---|---|
| 2,606,228 | 8/52 | Chouljian | 339—66 |
| 2,881,405 | 4/59 | Yarbrough | 339—17 |
| 3,011,379 | 12/61 | Corwin | 339—17 |
| 3,093,887 | 6/63 | Prestige et al. | 29—155.55 |

JOSEPH D. SEERS, *Primary Examiner.*